United States Patent
Morita et al.

(10) Patent No.: US 7,364,805 B2
(45) Date of Patent: Apr. 29, 2008

(54) CRYSTAL FILM, CRYSTAL SUBSTRATE, AND SEMICONDUCTOR DEVICE

(75) Inventors: Etsuo Morita, Kanagawa (JP); Yousuke Murakami, Kanagawa (JP); Goshi Biwa, Kanagawa (JP); Hiroyuki Okuyama, Kanagawa (JP); Masato Doi, Kanagawa (JP); Toyoharu Oohata, Kanagawa (JP)

(73) Assignee: Sony Corporation (JP)

( * ) Notice: Subject to any disclaimer, the term of this patent is extended or adjusted under 35 U.S.C. 154(b) by 402 days.

(21) Appl. No.: 10/466,607

(22) PCT Filed: Jan. 18, 2002

(86) PCT No.: PCT/JP02/00332

§ 371 (c)(1),
(2), (4) Date: Nov. 20, 2003

(87) PCT Pub. No.: WO02/058120

PCT Pub. Date: Jul. 25, 2002

(65) Prior Publication Data
US 2004/0067648 A1    Apr. 8, 2004

(30) Foreign Application Priority Data
Jan. 18, 2001   (JP) ............................ 2001-010708

(51) Int. Cl.
*B32B 9/00* (2006.01)
*B63H 1/26* (2006.01)
*H01L 21/31* (2006.01)

(52) U.S. Cl. .................... 428/698; 438/758; 428/688; 428/689

(58) Field of Classification Search ................. None
See application file for complete search history.

(56) References Cited

U.S. PATENT DOCUMENTS 4,479,846 A * 10/1984 Smith et al. .................. 117/43
4,963,949 A * 10/1990 Wanlass et al. ............. 257/190

(Continued)

FOREIGN PATENT DOCUMENTS

JP      2000-232238 A1    8/2000

(Continued)

OTHER PUBLICATIONS

International Search Report dated Apr. 23, 2002.

*Primary Examiner*—Jennifer C. McNeil
*Assistant Examiner*—Jonathan Langman
(74) *Attorney, Agent, or Firm*—Rader Fishman & Grauer PLLC; Ronald P. Kananen

(57) ABSTRACT

A crystal foundation having dislocations is used to obtain a crystal film of low dislocation density, a crystal substrate, and a semiconductor device. One side of a growth substrate (11) is provided with a crystal layer (13) with a buffer layer (12) in between. The crystal layer (13) has spaces (13a), (13b) in an end of each threading dislocation $D_1$ elongating from below. The threading dislocation $D_1$ is separated from the upper layer by the spaces (13a), (13b), so that each threading dislocation $D_1$ is blocked from propagating to the upper layer. When the displacement of the threading dislocation $D_1$ expressed by Burgers vector is preserved to develop another dislocation, the spaces (13a), (13b) vary the direction of its displacement. As a result, the upper layer above the spaces (13a), (13b) turns crystalline with a low dislocation density.

14 Claims, 13 Drawing Sheets

U.S. PATENT DOCUMENTS

| | | | |
|---|---|---|---|
| 5,006,908 A * | 4/1991 | Matsuoka et al. | 257/76 |
| 6,015,979 A * | 1/2000 | Sugiura et al. | 257/86 |
| 6,111,277 A * | 8/2000 | Ikeda | 257/99 |
| 6,214,108 B1 * | 4/2001 | Okamoto et al. | 117/95 |
| 6,329,667 B1 * | 12/2001 | Ota et al. | 257/13 |
| 6,468,347 B1 * | 10/2002 | Motoki et al. | 117/89 |
| 6,700,179 B1 | 3/2004 | Ouchi et al. | |
| 6,794,210 B2 | 9/2004 | Ouchi et al. | |

FOREIGN PATENT DOCUMENTS

| | | |
|---|---|---|
| JP | 2000-340511 A1 | 12/2000 |
| JP | 2000-357843 A1 | 12/2000 |
| JP | 2001-102307 A1 | 4/2001 |

\* cited by examiner

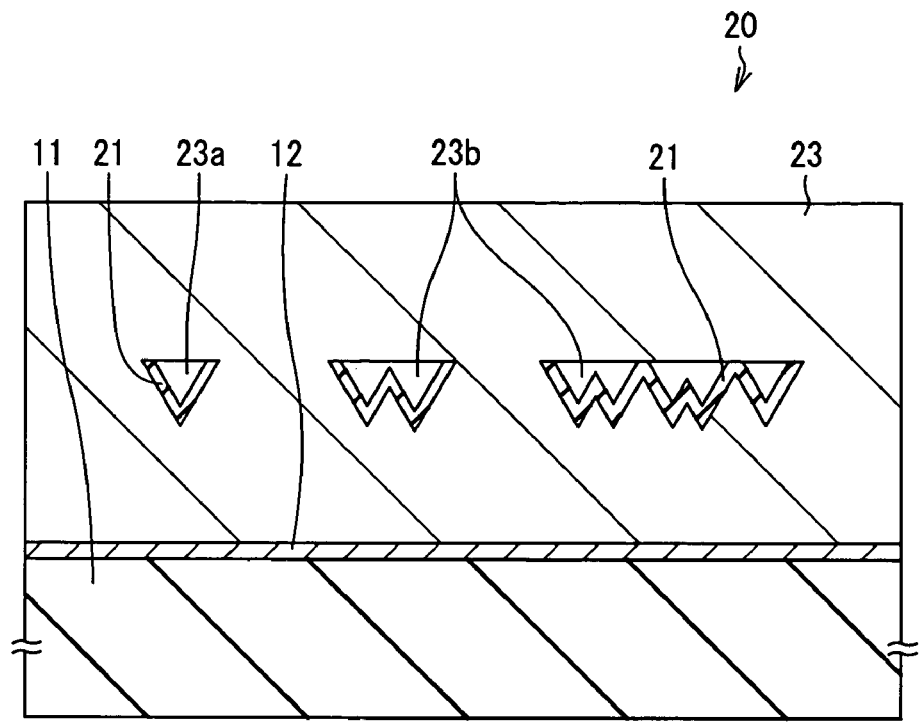
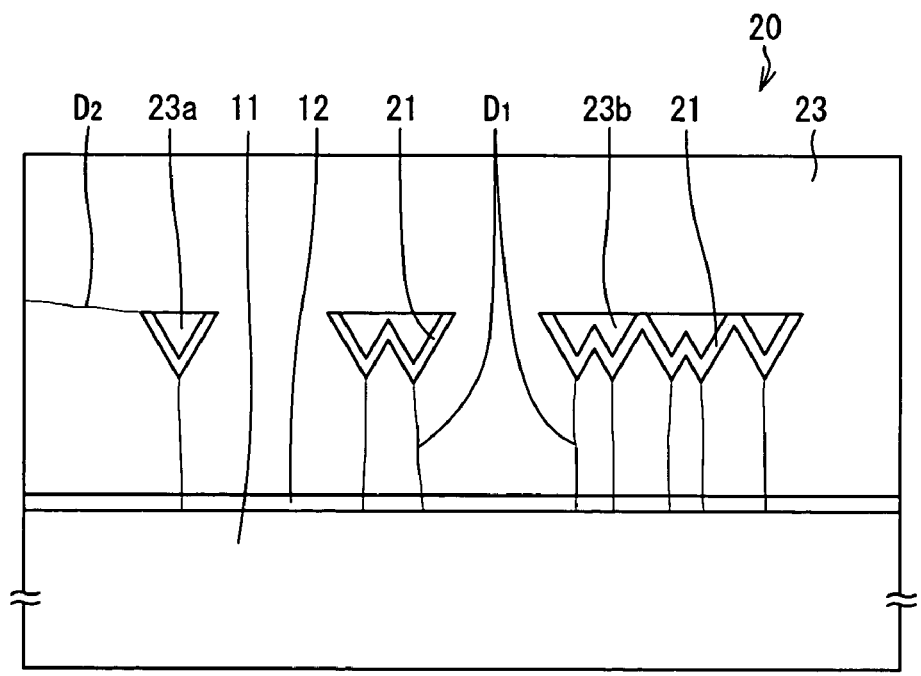

CRYSTAL FILM, CRYSTAL SUBSTRATE, AND SEMICONDUCTOR DEVICE

TECHNICAL FIELD

The present invention relates to a crystal film and a crystal substrate, and a semiconductor device using the same, and specifically to a crystal film made of nitride III-V compounds, a crystal substrate and a semiconductor device such as a laser diode.

RELATED ART

In recent years, a nitride III-V compound semiconductor made of Group 3B elements such as aluminum (Al), gallium (Ga), indium (In) or the like and Group 5B elements including nitrogen (N) has drawn attention as a material capable of emitting light from a visible band ranging from green to blue to a near ultraviolet band. As a result, a semiconductor device such as a laser diode (LD) and a light emitting diode (LED) using the nitride III-V compound semiconductor is developed. Specifically, continuous oscillation is realized in the laser diode and an improvement in the crystalline of the nitride III-V compound semiconductor layer is demanded to realize longer operating life.

However, a substrate suitable for crystal growth has not been achieved in the nitride III-V compound semiconductor. The nitride III-V compound semiconductor such as GaN has a smaller lattice constant than other semiconductor crystals, so there is no common substrate having similar lattice constant and thermal expansion coefficient to the nitride III-V compound semiconductor. Only the GaN substrate with a lot of cracks and dislocations in the crystal is obtained, although this is best suited for the growth. Accordingly, various different substrates such as sapphire ($\alpha$-$Al_2O_3$) have been used instead. Dislocations due to the lattice mismatching are reduced by depositing a buffer layer of AlN or $Al_xGa_{1-x}N$ ($0 \leq x \leq 1$) at a low temperature of 900° C. or below on the substrate (Japanese Patent Laid-Open No. Sho 63-188938 and Publication of Examined Application No. Hei 8-8217). However, obtaining a high quality crystal film has limitations and therefore, a technique for achieving a crystal film with lower threading dislocation density has been demanded.

To achieve this, a technique for improving the crystalline has been studied and recently, a method of growing the crystal in the lateral direction attracts attention. For example, Japanese Patent Laid-Open No. Hei 10-312971 discloses a method of laterally growing the upper layer of the crystal film on a two-dimensionally patterned mask with a stripe shape or the like, after growing the lower layer of the crystal film. With this method, dislocations from an opening of the mask to an upper layer are crooked above the mask by the lateral growth and threading dislocation density is reduced in, particularly, the upper part of the mask in the upper layer. The publication also discloses that repeating the lateral growth several times to alternately displace the mask position can further reduce the threading dislocation density.

In addition, a method in which a low dislocation density region is formed in a desired region by crooking dislocations taking advantage of difference in the growth rate according to the crystal growth face has been proposed (refer to Japanese Patent Laid-Open No. Hei 11-130597, for example).

Furthermore, as a technique using the lateral growth, the method of growing the crystal film by using a seed crystal film formed on a growth substrate as a base has been proposed (MRS Internet J. Nitride Semicond. Res. 4S1, G3.38 (1999), MRS Internet J. Nitride Semicond. Res. 4S1, G4.9 (1999) and Nakamura et al.; The 46th Spring Meeting 1999; The Japan Society of Applied Physics and Related Societies, page 31-N-8, for example). This method forms a region having a low threading dislocation density on the top surface because the crystal film grows in the lateral direction from the side surface of the seed crystal film and dislocations in the crystal film are crooked.

A method of forming the region having little defects by re-growing the crystal film after obtaining the recess structure by etching the seed crystal film has been reported (Ishida et al.; The 46th Spring Meeting 1999; The Japan Society of Applied Physics and Related Societies, page 30-M17). The recess structure may further reduce the defects in the crystal when depositing the silicon nitride ($SiN_x$) film on the sides and the bottom surfaces (Ishibashi et al.; The 46th Spring Meeting 1999; The Japan Society of Applied Physics and Related Societies, page 28-YQ-4). A method of forming an island shaped seed crystal by self-assembly with the treatment using silane ($SiH_4$) on the surface of the crystal film has been reported (H. Lahreche, P. Vennegues, B. Beaumont and P. Gibart; J. Crystal Growth 205, 245 (1999)). This method facilitates the formation of the seed crystal without an etching process or the like.

However, most of the above-described methods require a mask formation step when forming the mask or seed crystal film and crystal growth more than once. As a result, a lot of processes are required and this causes a problem with productivity.

The patterning of the mask or seed crystal film is performed regardless of the dislocation distribution on the surface, so dislocations are propagated from the region between the masks or the top surface of the seed crystal film. Moreover, dislocations themselves are crooked and remain in the crystal. Therefore, dislocations are not reduced unless dislocations intersect with each other to combine the displacement. Dislocations may be shifted to the displacement of another direction, so dislocations do not always counteract even when dislocations intersect with each other. This reveals that the conventional technique using the lateral growth has a limit of reduction in the dislocation density.

The crystal substrate fabricated with the above-described methods has threading dislocations extended from a mask gap or the crystal film and the connecting portion on the top surface thereof. In general, the spaces of the mask and the crystal film are constant and threading dislocations occur periodically corresponding to the spaces. Accordingly, in order to fabricate the semiconductor device with the crystal having little dislocations, the semiconductor layer is formed by growing the major functions thereof (a light emitting region in a laser, for example) in a region having a low threading dislocation density in the crystal substrate as described above to avoid the fatal dislocations for the device. To achieve this, each formation region of the substrate and the device needs to be aligned to a position with extremely good precision. This has resulted in alignment problems and limits the size of the device.

The present invention has been achieved in view of the above problems. It is an object of the invention to provide a crystal film and a crystal substrate capable of reducing the dislocation density effectively and a semiconductor device using the same.

SUMMARY OF THE INVENTION

A crystal film of an embodiment of the invention is grown on a base layer having dislocations, wherein a space corresponding to an end of a dislocation to be propagated from the base layer to an upper layer is formed.

Another crystal film of an embodiment of the invention comprises a dislocation blocking portion for blocking the propagation of the dislocations corresponding to an end of a dislocation to be propagated from the base layer to an upper layer.

A crystal substrate and a semiconductor device of and embodiment of the invention comprise a crystal film formed with a space or a dislocation blocking portion for blocking the propagation of the dislocations in the position corresponding to an end of a dislocation to be propagated from a base layer to an upper layer.

In a crystal film of an embodiment of the invention, spaces are provided on each end of dislocation, so the dislocation density in the portion formed above the spaces is reduced.

In another crystal film of an embodiment of the invention, a dislocation blocking portion is provided on each end of dislocation. As a result, the dislocation density in the portion formed above the spaces is reduced.

The crystal substrate and the semiconductor device of an embodiment of the invention comprise the crystal film of one of the embodiments of the invention, so the dislocation density on the upper layers on the substrate is reduced.

Other and further objects, features and advantages of the invention will appear more fully from the following description.

BRIEF DESCRIPTION OF THE DRAWINGS

FIG. 1A is a cross sectional view and FIG. 1B is a view showing the occurrence of dislocations of the crystal substrate shown in FIG. 1A.

FIGS. 4A and 4B show the structure of the crystal substrate according to a second embodiment of the invention. FIG. 4A is a cross sectional view and FIG. 4B is a view showing the occurrence of dislocations of the crystal substrate shown in FIG. 4A.

FIG. 6A is a cross sectional view and FIG. 6B is a view showing the occurrence of dislocations of the crystal substrate shown in FIG. 6A.

FIG. 8A is a cross sectional view and FIG. 8B is a view showing the occurrence of dislocations of the crystal substrate shown in FIG. 8A.

DETAILED DESCRIPTION OF THE INVENTION

Embodiments of the present invention will be described in more detail below referring to the accompanying drawings.

First Embodiment

Figure 1A:
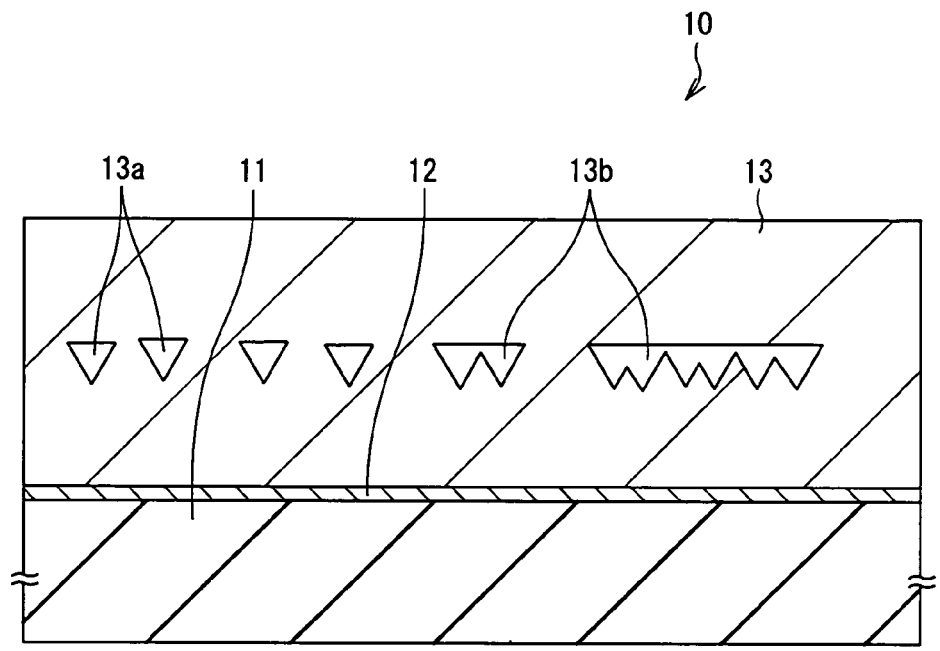
FIGS. 1A and 1B show the structure of the crystal substrate according to a first embodiment of the invention.
Figure 1B:
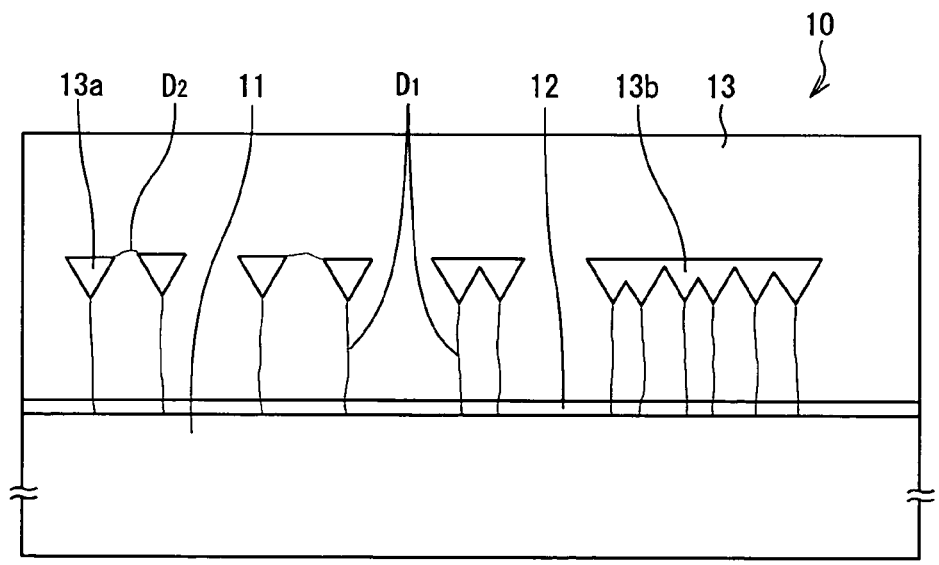

FIG. 1A shows a sectional structure of a crystal substrate 10 according to a first embodiment of the invention. FIG. 1B is a view showing dislocations of the crystal substrate 10 shown in FIG. 1A. In the crystal substrate 10, a crystal layer 13 is formed on a growth substrate 11 with a buffer layer 12 in between.

The growth substrate 11 is made of a crystalline material such as sapphire, silicon carbide (SiC), gallium nitride (GaN), gallium arsenide (GaAs), silicon (Si), a composite oxide of magnesium and aluminum ($MgAl_2O_4$; spinel), or a composite oxide of lithium and gallium ($LiGaO_2$), and has a thickness of 400 μm, for example. The growth substrate 11 may be made of III-V compounds including at least one element selected from Group 3B elements and at least arsenic (As) and phosphorus (P) selected from Group 5B elements. The crystal substrate having dislocations are widely applicable as the growth substrate 11.

The buffer layer 12 is a core layer for growing the crystal layer 13 and is formed of GaN having a thickness of 30 nm, for example. The buffer layer 12 has threading dislocations $D_1$ propagate to the crystal layer 13. Threading dislocations $D_1$ are caused by the lattice mismatching or difference of the thermal expansion coefficient between the growth substrate 11 and the buffer layer 12 and its density is about $3 \times 10^8$ $cm^{-2}$, for example.

The crystal layer 13 is formed of a crystal of the wurtzite structure. An example of a crystal of the wurtzite structure is nitride III-V compounds including at least one element selected from Group 3B elements and at least nitrogen (N) selected from Group 5B elements in the short periodic table. The crystal layer 13 corresponds to an example of the "crystal film" of the invention.

In the crystal layer 13, the threading dislocations $D_1$ penetrate from the buffer layer 12 formed thereunder, and a space 13a is formed on each end of the individual threading dislocations $D_1$. The spaces 13a may be connected to each other dependent upon the density of threading dislocations $D_1$, thereby forming a space 13b. Dislocations penetrate to the bottom of the spaces 13a and 13b and are prevented from propagating to the upper layers on the spaces 13a and 13b.

The shape of the space 13a is polyangular pyramid with the portion penetrating to the threading dislocation $D_1$ as the apex or cone-shaped hollow with the portion penetrating to the threading dislocation $D_1$ as the center. An example of the polyangular pyramid is an inverted six-sided pyramid composed of six crystal faces (1101) (S faces). The combined spaces 13a form a shape of the space 13b. The cross sectional surface of the space 13b is the shape in which the inverted triangles with the portion penetrating to the threading dislocation $D_1$ as the center continues like the teeth of a saw or the shape in which the space of the cone-shaped hollow with the portion penetrating to the threading dislocation $D_1$ as the center continues. Assuming the density of threading dislocations $D_1$ penetrating to the spaces 13a and 13b is b, the average distance between each threading dislocation $D_1$ becomes $b^{-1/2}$, so when forming the space 13b by combining the individual spaces 13a corresponding to each threading dislocation $D_1$, each space 13a needs to be formed to have a diameter of $b^{-1/2}$ or more, for instance.

When growing the crystal in the lateral direction, vacancy may be formed in the connecting portion of the crystals grown in the lateral direction. This vacancy is different from the spaces 13a and 13b. The spaces 13a and 13b are the region where the crystal is discontinuous in three dimensions and the inside thereof may be a vacuum. Alternatively, a no-crystallized amorphous-material may be left at least in part, or gas or liquid may be filled, or these states may be simultaneous.

In the crystal layer 13, when new dislocations occur from the spaces 13a and 13b during the crystal growth, the new dislocations each have displacement equivalent to the sum of the displacement of the threading dislocations $D_1$, that is, the sum of the Burgers vector. However, in the space 13b, when the total sum of the displacement of threading dislocations $D_1$ is 0, no dislocations occur and the propagation of dislocations to the upper layers can be suppressed. Further, when the sum of the displacement of threading dislocations $D_1$ is not 0, the displacement of threading dislocations $D_1$ is generally synthesized to couple threading dislocations $D_1$. Therefore, the number of new dislocations occurring from the spaces 13a and 13b is smaller than that of threading dislocations $D_1$. The upper parts of the spaces 13a and 13b are grown in the lateral direction as described hereinafter, so the direction of the displacement of threading dislocations $D_1$ is changed in the crystal growth process and new dislocations $D_2$ can be propagated in the lateral direction. This enables the suppression of the propagation of dislocations above the spaces 13a and 13b. As a result, the dislocation density in the upper layers on the crystal layer 13 is lower than that of the lower layers. When the diameter of the space 13b corresponding to each threading dislocation $D_1$ is set to 30 nm or more, more dislocations can be synthesized and more Burgers vectors cancel each other.

The crystal substrate 10 is fabricated as follows.

Figure 2:
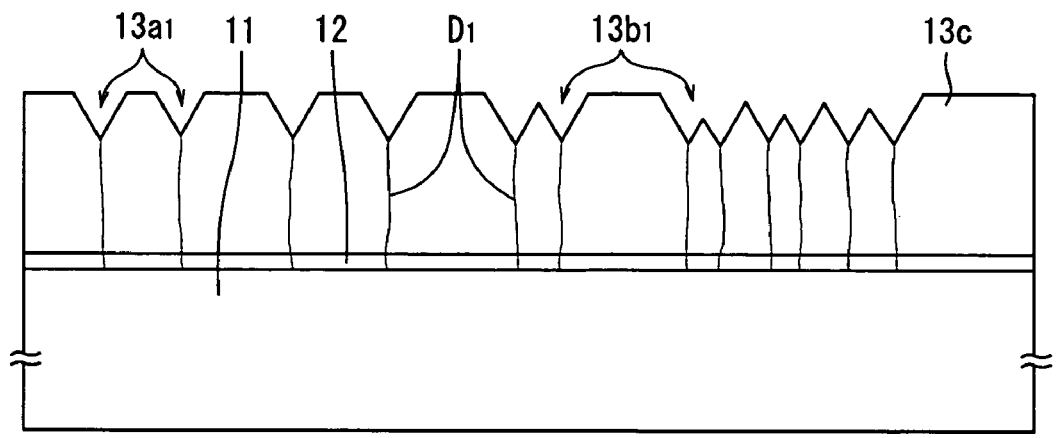
FIG. 2 is a view for explaining a method of manufacturing the crystal substrate shown in FIGS. 1A and 1B.

First, as shown in FIG. 2, the growth substrate 11 is prepared. The buffer layer 12 made of GaN is grown on a surface of the growth substrate 11 (when the growth substrate 11 is made of sapphire, it is grown on the c face, for example) by, for example, MOCVD (Metalorganic Chemical Vapor Deposition). At this time, the temperature (growth temperature) of the growth substrate 11 is 520° C., for example. On the buffer layer 12, a lower layer 13c of the crystal layer 13 made of, for example, nitride III-V compounds is grown at 1000° C. The threading dislocations $D_1$ exist in the lower layer 13c.

When performing MOCVD, trimethyl gallium (($CH_3)_3$Ga) as a source gas of gallium, trimethyl aluminum (($CH_3)_3$Al) as a source gas of aluminum, trimethyl indium (($CH_3)_3$In) as a source gas of indium, trimethyl boron (($CH_3)_3$B) as a source gas of boron are used as a source gas of Group 3B elements, for example. As a source gas of Group 5B elements, ammonia ($NH_3$) is used as a source gas of nitrogen, for instance. Examples of a carrier gas are hydrogen ($H_2$) and nitrogen ($N_2$). When growing the crystal layer 13 (the lower layer 13c and an upper layer described later), impurities such as silicon (Si) or magnesium (Mg) may be added, if necessary. In this case, monosilane ($SiH_4$) is used as a source gas of silicon and bis=cyclopentadienyl magnesium (($C_5H_5)_2$Mg) is used as a source gas of magnesium, for example.

Next, the supply of the source gas of Group 3B elements is stopped and heat treatment is performed at 1000° C. or above (for example, 1020° C.) for determined time (for example, three minutes) in the atmosphere containing hydrogen. At this time, etching by heat and hydrogen gas intensively proceeds around the threading dislocations $D_1$ due to the weak strength. Accordingly, etch pits $13a_1$ and $13b_1$ are formed on the surface of the lower layer 13c spontaneously corresponding to each threading dislocation $D_1$. The meaning of "spontaneously corresponding" here is that the etch pits $13a_1$ and $13b_1$ connect to the threading dislocations $D_1$ without patterning by lithography or the like. It is preferable that the etch pits $13a_1$ and $13b_1$ are formed by adjusting the growth conditions to have the diameter corresponding to the dislocation density b of $b^{-1/2}$ or more and become the etch pit $13b_1$ connecting to the plural threading dislocations $D_1$. The depth of the etch pits $13a_1$ and $13b_1$ are 30 nm or more and preferably 100 nm or more. Etching may be performed on the interface with the growth substrate 11.

Then the supply of the source gas of Group 3B elements is restarted and the upper layer of the crystal layer 13 is grown. The growth rate on the surface of the lower layer 13c is higher than the upper of the etch pits $13a_1$ and $13b_1$, and the lateral growth proceeds to cover the etch pits $13a_1$ and $13b_1$ to form the spaces 13a and 13b. Thereby, the spaces 13a and 13b are provided on an end of each threading dislocation $D_1$ and the threading dislocations $D_1$ are blocked from the upper layer.

When the sum of the displacement of threading dislocations $D_1$ connect to the space 13b (etch pit $13b_1$) is 0, no new dislocations occur. Even when the sum of the displacement of threading dislocations $D_1$ is not 0, the displacement of threading dislocations $D_1$ is generally synthesized to couple the threading dislocations $D_1$. Therefore, the number of new dislocations occurring from the space 13b is smaller than that of threading dislocations $D_1$. Further, when the direction of the displacement of threading dislocations $D_1$ is changed due to the spaces 13a and 13b (etch pits $13a_1$ and $13b_1$), new dislocations occurring from the spaces 13a and 13b (the dislocations $D_2$ shown in FIG. 1B, for example) can be propagated in the lateral direction. This reduces the dislocation density in the region from the spaces 13a and 13b to the surface of the crystal layer 13 (that is, the upper layer).

Growing the upper layer more than a certain time substantially smoothes the growth surface. Thereby, the crystal layer 13 and the crystal substrate 10 shown in FIGS. 1A and 1B are obtained.

As described, in the embodiment, the spaces 13a and 13b are provided in the crystal layer 13 to correspond to each threading dislocation $D_1$. As a result, the spaces 13a and 13b prevent the propagation of the threading dislocations $D_1$ to the upper layer and the dislocation density in the upper layer can be reduced. This enables to easily obtain the crystal layer 13 having uniformly reduced dislocation density in the upper layer. Specifically, in the space 13b, each displacement of threading dislocations $D_1$ is synthesized with high ratio and dislocations can be reduced efficiently.

As described, there has been a problem that dislocations are propagated from the mask or the seed crystal because conventionally the mask or the seed crystal is patterned regardless of the dislocation distribution. However, this problem is solved in the embodiment. When the semiconductor device is manufactured by use of such a crystal substrate 10, the alignment of the substrate is not required. From this viewpoint, it is found that in the crystal substrate of the invention, dislocations are effectively reduced compared to the conventional crystal substrate.

The etch pits $13a_1$ and $13b_1$, and the spaces $13a$ and $13b$ are spontaneously formed, so the threading dislocation density in the upper layer of the crystal layer 13 is reduced easily and efficiently. Furthermore, the etch pits $13a_1$ and $13b_1$ are formed in the MOCVD device. As a result, the crystal layer 13 is easily obtained with fewer manufacturing steps.

(Modification)

Figure 3:
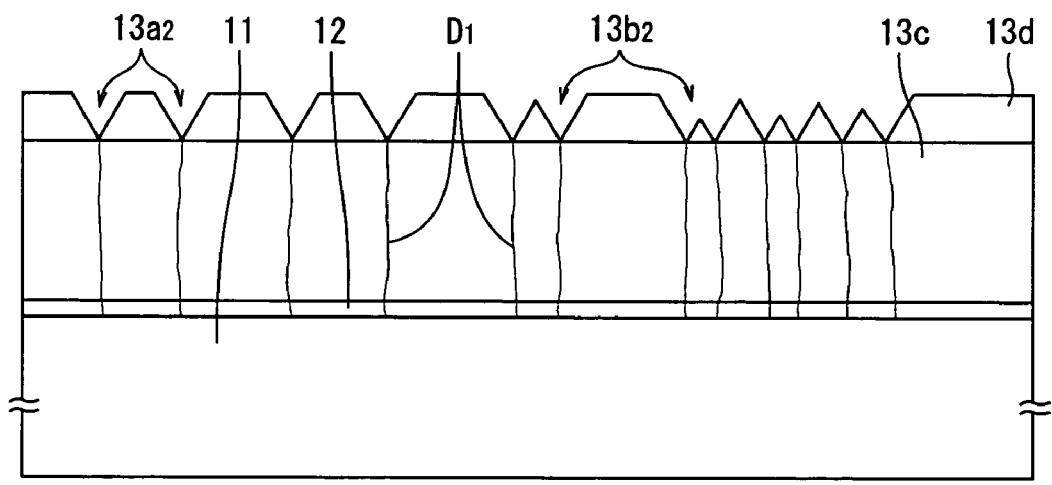
FIG. 3 is a view for explaining another method of manufacturing the crystal substrate shown in FIGS. 1A and 1B.

In the above first embodiment, the spaces $13a$ and $13b$ are formed utilizing the etch pits $13a_1$ and $13b_1$. However, as shown in FIG. 3, the growth pits $13a_2$ and $13b_2$ may be formed instead of the etch pits $13a_1$ and $13b_1$.

The growth pits $13a_2$ and $13b_2$ are formed as follows, for example. After growing the lower layer $13c$ with a growth temperature of 1000° C. or higher, the supply of the source gas of Group 3B elements is stopped to reduce the growth temperature to 850° C. The supply of the source gas of Group 3B elements is again started to grow a middle layer $13d$ of the crystal layer 13 10 nm or more, preferably 30 nm or more, and more preferably 50 nm or more, for example 100 nm. At that time, the growth pits $13a_2$ and $13b_2$ are spontaneously formed in the middle layer $13d$ corresponding to each threading dislocation $D_1$. The depth in the laminate direction is 10 nm to 100 nm, for instance. The growth pits $13a_2$ and $13b_2$ are spontaneously formed corresponding to the threading dislocations $D_1$ because the crystal film grown with the growth temperature of 1000° C. or lower by MOCVD tends to generate the growth pits in general. The shape of the growth pits $13a_2$ and $13b_2$ is the same as that of the etch pits $13a_1$ and $13b_1$. The growth pits $13a_2$ and $13b_2$ may be formed by growing the middle layer $13d$ with rapidly reduced growth rate. To change the growth rate, the supply of Group 3B elements source gas may be changed or the ratio of the supply of Group 3B elements source gas and the supply of Group 5B elements source gas may be changed. In addition, the growth pits $13a_2$ and $13b_2$ may be formed by changing the pressure (growth pressure) in the MOCVD device during the growth. The above described growth conditions may be simultaneously changed.

Next, the crystal layer 13 is grown to cover the upper part of the growth pits $13a_2$ and $13b_2$ formed as described above to form the space (refer to FIGS. 1A and 1B). As a method of forming the space, the growth rate is rapidly increased to stimulate the lateral growth, thereby the crystal is grown to cover the upper part of the growth pits $13a_2$ and $13b_2$ and the space is formed inside the crystal layer 13. To change the growth rate, the supply of Group 3B elements source gas may be changed or the ratio of the supply of Group 3B elements source gas and the supply of Group 5B elements source gas may be changed. The growth pits $13a_2$ and $13b_2$ may be formed by changing the pressure (growth pressure) in the MOCVD device during the growth. The above described growth conditions may be simultaneously changed.

Other embodiments will be described in the following. The same numerals will be given to the same component as the first embodiment and the detailed explanation thereof will be omitted.

Second Embodiment

FIG. 4A shows a sectional structure of a crystal substrate 20 of a second embodiment. FIG. 4B schematically shows dislocations of the crystal substrate 20 shown in FIG. 4A. The crystal substrate 20 has the same structure as the crystal substrate 10 of the first embodiment except that the crystal substrate 20 comprises a crystal layer 23 instead of the crystal layer 13 of the first embodiment.

The crystal layer 23 of the embodiment has spaces $23a$ and $23b$ like the spaces $13a$ and $13b$ of the first embodiment. However, a coat film 21 including, for example at least one of oxygen, nitrogen, fluorine or carbon is provided on the inner surface of the spaces $23a$ and $23b$. The coat film 21 is preferably amorphous to avoid the growth of the crystal thereon. As the material of the coat film 21, a metal material such as aluminum (Al), gallium (Ga), indium (In), magnesium (Mg), zirconium (Zr) or titanium (Ti), silicon (Si) oxide, nitride, fluoride, and carbide are cited. The above metal materials, simple substance of silicon, resist or other organic materials may be used to form the coat film 21.

Figure 5A:
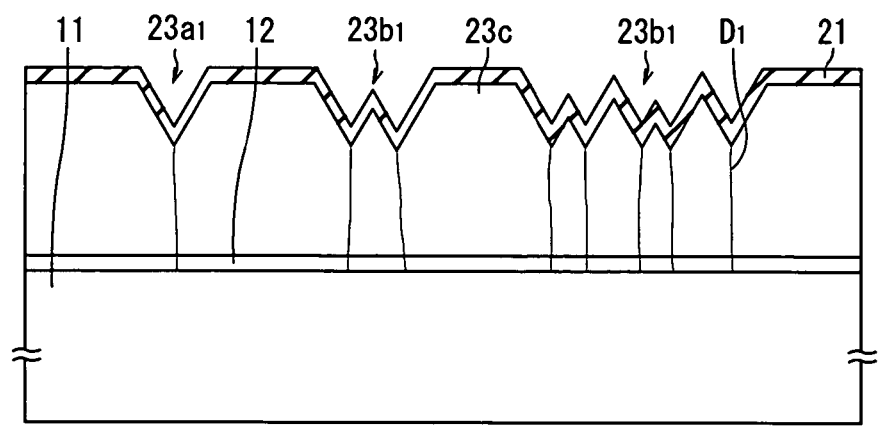
FIGS. 5A and 5B are views for explaining a method of manufacturing the crystal substrate shown in FIGS. 4A and 4B.

To form the crystal substrate 20, first, as shown in FIG. 5A, etch pits $23a_1$ and $23b_1$ are formed like the first embodiment, for instance, and after that, the supply of the source gases of Group 3B elements and Group 5B elements is stopped and the gas containing silicon and oxygen is supplied to the etch pits $23a_1$ and $23b_i$. Thereby, the coat film 21 including silicon and oxygen is formed in the etch pits $23a_1$ and $23b_i$. At this time, it is preferable that the thickness of the coat film 21 becomes thicker closer to the depth direction of the etch pits $23a_1$ and $23b_1$.

The coat film 21 may be formed of the materials in addition to the above-described materials. For example, the coat film 21 made of gallium oxide may be formed by supplying the gas containing gallium and oxygen, and the coat film 21 made of silicon nitride may be formed by supplying the gas containing silicon and nitrogen gas.

Figure 5B:
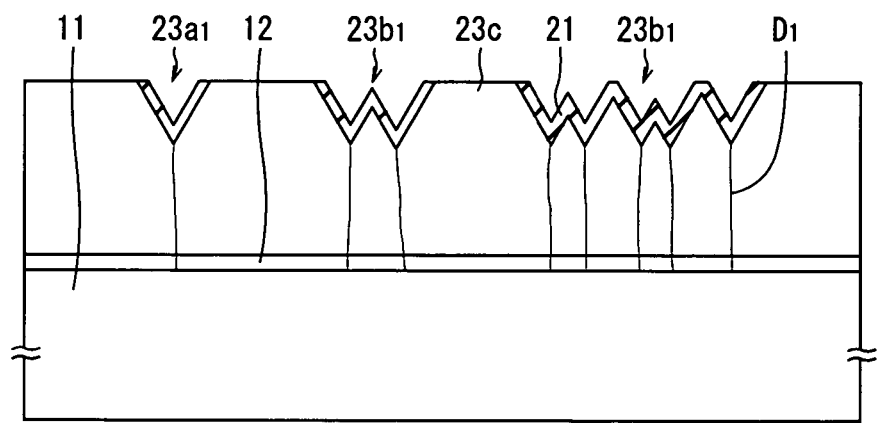

After forming the coat film 21, as shown in FIG. 5B, dry etching such as RIE is performed in the atmosphere containing hydrogen, for instance. At this time, since the surface of a lower layer $23c$ is in contact with etching gas, etching is more proceeded here than the etch pits $23a_1$ and $23b_i$. Accordingly, the parts formed on the lower layer $23c$ in the coat film 21 are selectively removed by etching. When the thickness of the coat film 21 becomes thicker in the depth direction of the etch pits $23a_1$ and $23b_1$, the coat film 21 can be removed easily. Here, etching is not limited to dry etching and wet etching may be also used.

Like the first embodiment, for example, the upper layer of the crystal layer 23 is grown to form the spaces $23a$ and $23b$ on the etch pits $23a_1$ and $23b_1$. Thereby, the crystal layer 23 and crystal substrate 20 shown in FIGS. 4A and 4B are achieved. Here, the coat film 21 is provided on the inner surface of the etch pits $23a_1$ and $23b_1$, so the control of the growth conditions for forming the spaces $23a$ and $23b$ can be facilitated.

As described, in the embodiment, the coat film 21 is provided on the surface of the etch pits $23a_1$ and $23b_1$. As a result, the growth conditions at the time of forming the spaces $23a$ and $23b$ by growing the upper layer of the crystal layer 23 can be eased and the formation thereof can be facilitated.

Third Embodiment

Figure 6A:
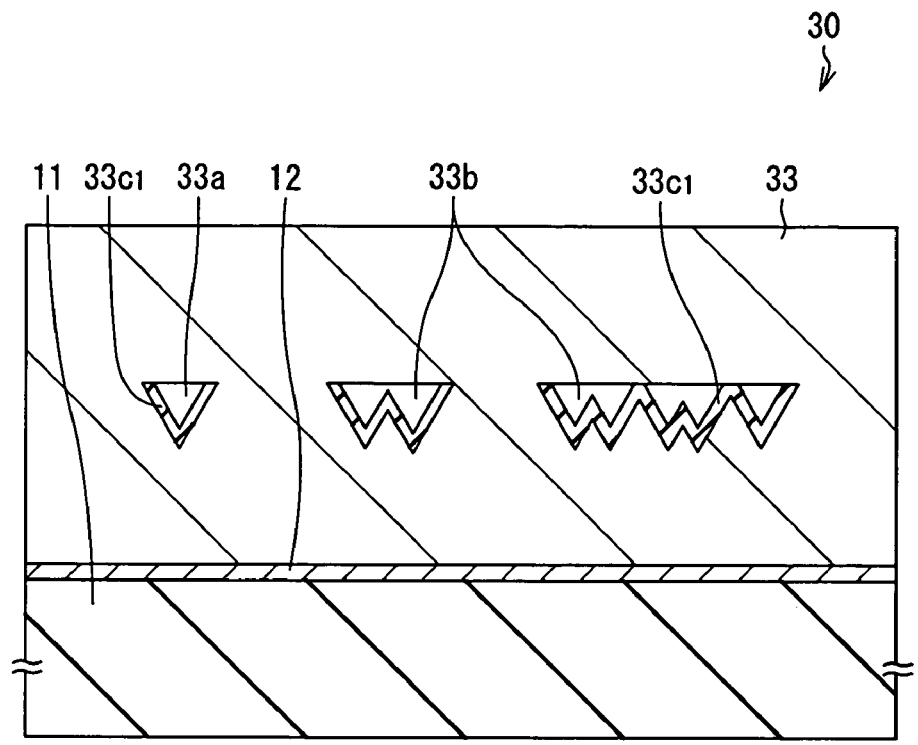
FIGS. 6A and 6B show the structure of the crystal substrate according to a third embodiment of the invention.
Figure 6B:
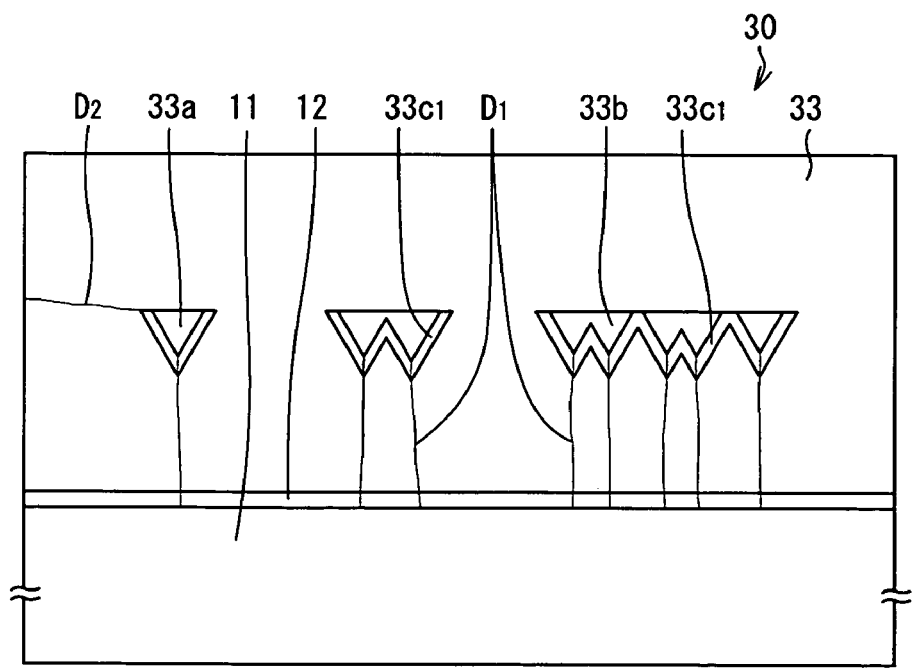

FIG. 6A shows a sectional structure of a crystal substrate 30 of a third embodiment. FIG. 6B schematically shows the crystal substrate 30 shown in FIG. 6A. The crystal substrate 30 has the same structure as the crystal substrate 10 of the first embodiment except that a crystal layer 33 is provided instead of the crystal layer 13 of the first embodiment. The crystal substrate 30 is fabricated as described hereinbelow.

Figure 7:
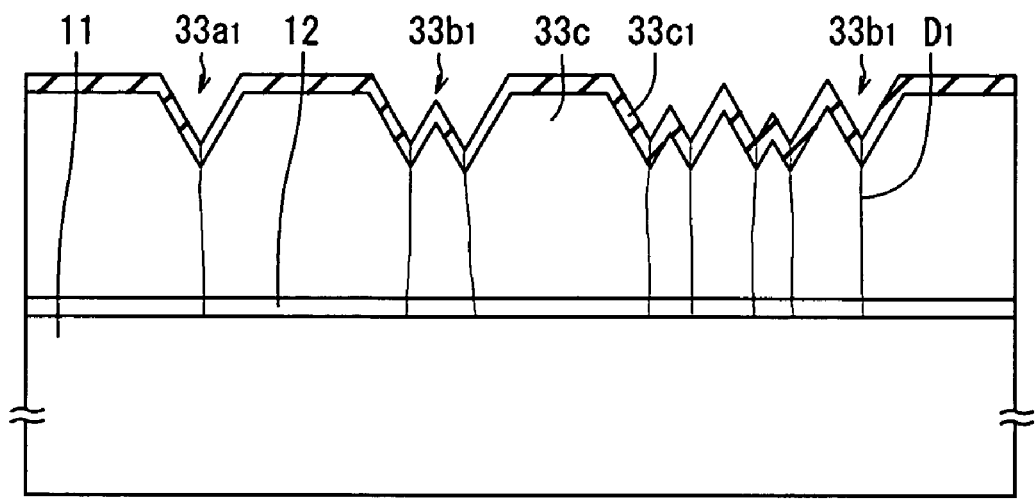
FIG. 7 is a view for explaining a method of manufacturing the crystal substrate shown in FIGS. 6A and 6B.

First, as shown in FIG. 7, like the first embodiment, etch pits $33a_1$ and $33b_1$ are formed on a surface of a lower layer 33c. Subsequently, at least one of oxidation, nitridation, fuluoridation and carbonization is performed on the surface of the lower layer 33c including the etch pits $33a_1$ and $33b_1$ to form a surface treatment region $33c_1$. The surface treatment region $33c_1$ has a thickness of, for example 1 nm in the thickness direction. Specifically, the surface treatment region $33c_1$ made of oxide of Group 3B elements is formed by stopping the supply of the source gases of Group 3B elements and nitrogen and supplying gas containing oxygen to react oxygen with Group 3B elements in the lower layer 33c. The surface treatment region $33c_1$ made of silicon nitride may be formed by supplying gas containing silicon to react silicon with nitrogen in the lower layer 33c. Further, the surface treatment region $33c_1$ made of gallium fluoride or gallium carbide may be formed by supplying gas containing fluorine or carbon to react fluorine or carbon with gallium in the lower layer 33c.

Next, for example, like the second embodiment, dry etching or wet etching is performed to selectively remove part of the surface treatment region $33c_1$. The following steps are the same as the second embodiment. Thereby, the crystal layer 33 and the crystal substrate 30 shown in FIGS. 6A and 6B are achieved.

As described, in the embodiment, the surface treatment region $33c_1$ is provided by performing the surface treatment on the surface of the etch pits $33a_1$ and $33b_1$. As a result, the growth conditions at the time of forming the spaces 33a and 33b by growing the upper layer of the crystal layer 33 can be eased and the formation thereof can be facilitated.

Fourth Embodiment

Figure 8A:
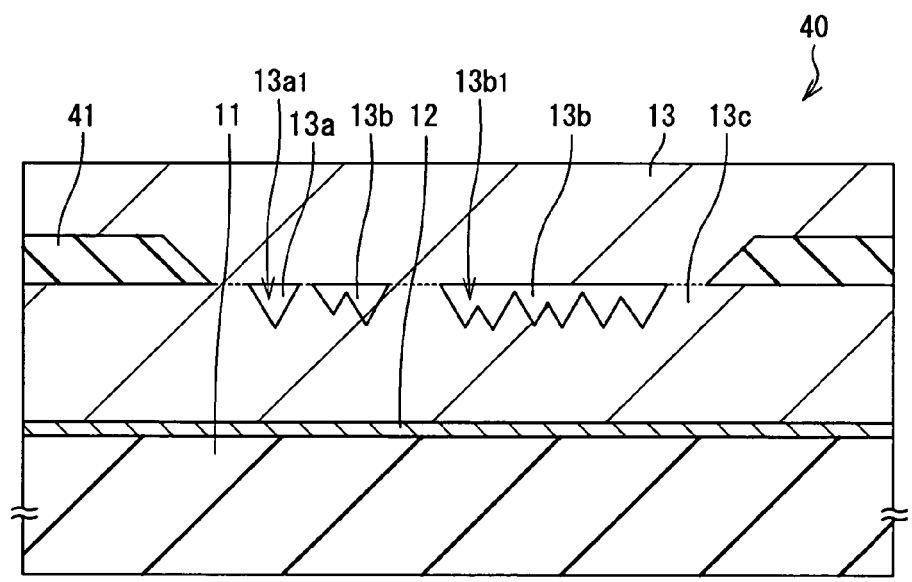
FIGS. 8A and 8B show the structure of the crystal substrate according to a fourth embodiment of the invention.
Figure 8B:
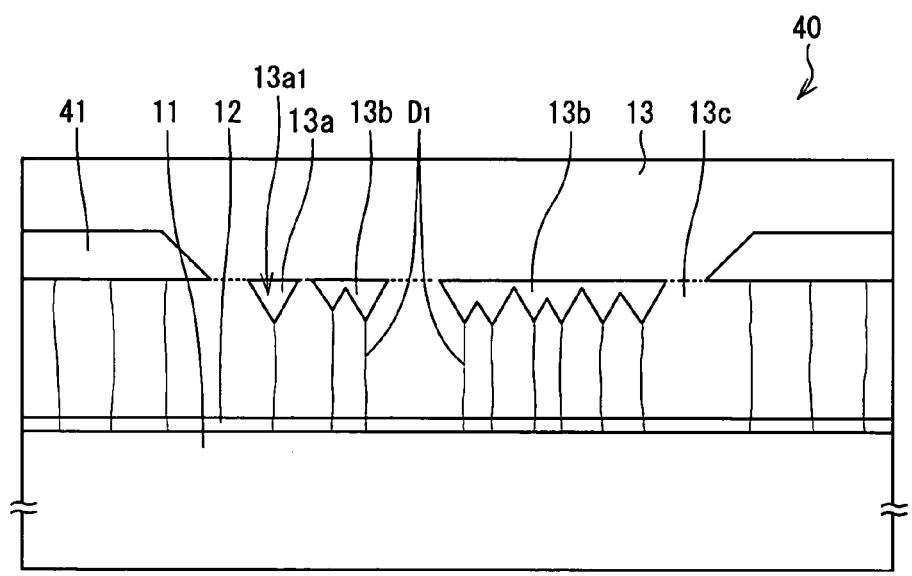

FIG. 8A shows a sectional structure of a crystal substrate 40 of a fourth embodiment. FIG. 8B schematically shows the crystal substrate 40 shown in FIG. 8A. The crystal substrate 40 comprises a mask 41 on a surface on which the spaces 13a and 13b are formed in the crystal layer 13 of the first embodiment. The crystal substrate 40 is fabricated as follows.

As shown in FIGS. 8A and 8B, first, the lower layer 13c is formed and a silicon oxide ($SiO_x$) film, a silicon nitride ($SiN_y$) film or laminated film thereof are formed thereon. After that, dry etching such as RIE (Reactive Ion Etching) is performed and the mask 41 which is patterned in stripe shape is formed. At that time, the width of the mask 41 is, for example, 5 μm and the space therebetween is 50 nm to 10 mm, for instance. The space may be equal or unequal. The pattern of the mask 41 may be other than stripe shape, for example, rectangular shape, lattice shape, hexagonal shape, triangular shape or circular shape.

Next, the etch pits $13a_i$ and $13b_1$ are formed like the first embodiment. Here, the etch pits $13a_1$ and $13b_1$ are formed by etching the surface in the opening region except mainly the mask 41. After that, the upper layer of the crystal layer 13 is grown to form the space 13b. Here, the upper layer starts to grow in the opening region between the masks 41, and to laterally grow on the mask 41. At that time, the threading dislocations $D_1$ are blocked by the space 13b in the opening region, so the propagation of the threading dislocations $D_1$ on the mask 41 is also reduced. Therefore, the whole upper layer has a low dislocation density. Thereby, the crystal layer 13 and the crystal substrate 40 are achieved.

As described, in the embodiment, the space 13b is provided. As a result, the crystal substrate 40 having uniformly low threading dislocation density can be obtained regardless of the position of the mask 41. Here, the upper layer is laterally grown with the mask 41 in between on the lower layer 13c, so even the threading dislocations $D_1$ not blocked by the space 13b exist, the threading dislocations $D_1$ are crooked in the lateral direction. Therefore, the dislocation density of the upper layer is further reduced.

The mask 41 reduces the formation region of the etch pits $13a_1$ and $13b_1$, so the growth conditions of the upper layer such as an increase in the growth rate can be tighten. The order of formation of the etch pits $13a_1$ and $13b_1$ and the mask 41 can be reversed and the formation position thereof can be open.

Fifth Embodiment

Figure 9:
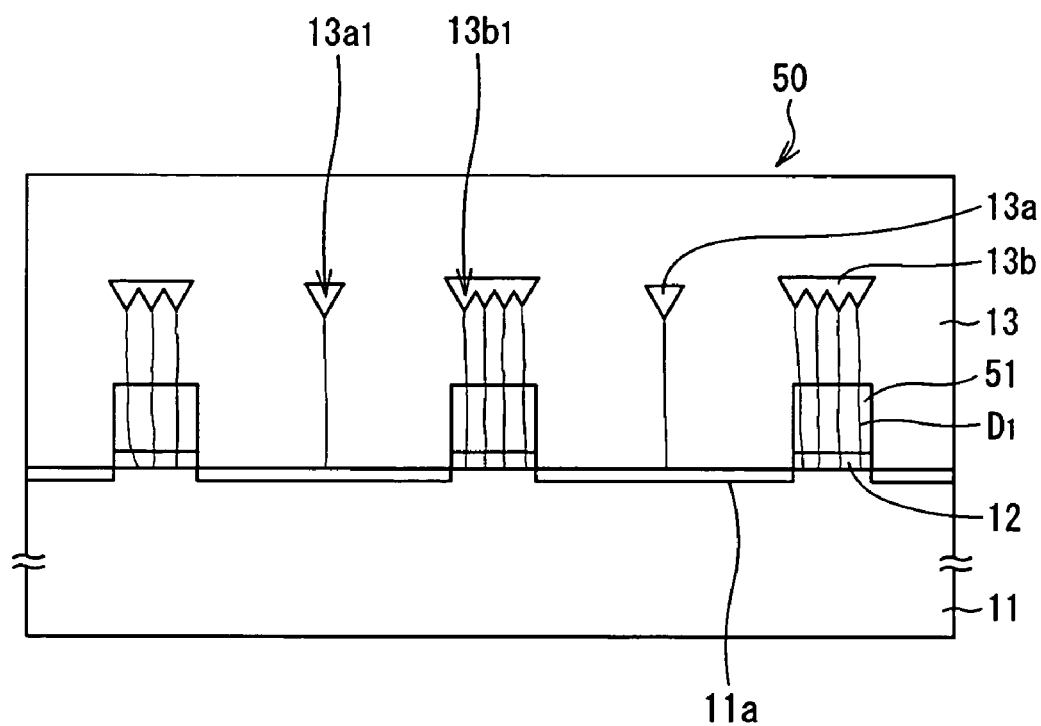
FIG. 9 is a sectional view of the structure of the crystal substrate according to a fifth embodiment of the invention.

FIG. 9 shows a sectional structure of a crystal substrate 50 of a fifth embodiment. The lower layer of the crystal substrate 50 is formed by lateral growth on a basis of a seed crystal 51 in the crystal layer 13 of the first embodiment. The crystal substrate 50 is fabricated as follows.

First, the buffer layer 12 is grown on the growth substrate 11 and then 2 μm-thick seed crystal film made of GaN is grown by MOCVD on the buffer layer 12, for instance. Subsequently, on the seed crystal film, a silicon nitride film or a silicon dioxide film (not shown) which is patterned in stripe shape is formed. Then, RIE is performed using the pattern as a mask and an unnecessary part in the seed crystal film is removed. RIE is again performed by using the same mask and a groove 11a is formed in the growth substrate 11 so that the crystal at the time of the lateral growth is not in contact with the growth substrate 11. After that, wet etching is performed, for example and the mask (not shown) is removed. Thereby, the seed crystal 51 is formed.

Using the seed crystal 51 as a base, the lower layer of the crystal layer 13 is grown by MOCVD, for example. The growth of the lower layer advances from the top surface of the seed crystal 51 to the upward direction and from the sidewalls to the lateral direction. At that time, the threading dislocations $D_1$ are propagated to the top of the seed crystal 51. In other parts, dislocations occur in the connecting portion with the lateral growth. However, almost no threading dislocations $D_1$ exist. The lateral growth rate is larger than growth rate in the top surface, so the growth surface becomes substantially flat as certain time advances.

Similar to the first embodiment, the etch pits $13a_1$ and $13b_1$ are formed on a surface of the lower layer. As described above, the threading dislocation density is high in the upper part of the seed crystal 51, so a lot of etch pits $13a_1$ and $13b_1$ are formed. In addition, the etch pits $13a_1$ and $13b_1$ are formed corresponding to the threading dislocations $D_1$ generated in the connecting portion. The upper layer of the crystal layer 13 is grown to form the spaces 13a and 13b in the position of the etch pits $13a_1$ and $13b_1$. Further growth of the upper layer substantially smoothes the growth surface. Thereby, the crystal layer 13 and the crystal substrate 50 are achieved.

As described, the crystal layer 13 is the lateral growth region utilizing the seed crystal 51. Further, the threading dislocation density is low in the lower layer. This enables to reduce the threading dislocation density in the upper layer.

Sixth Embodiment

Figure 10:
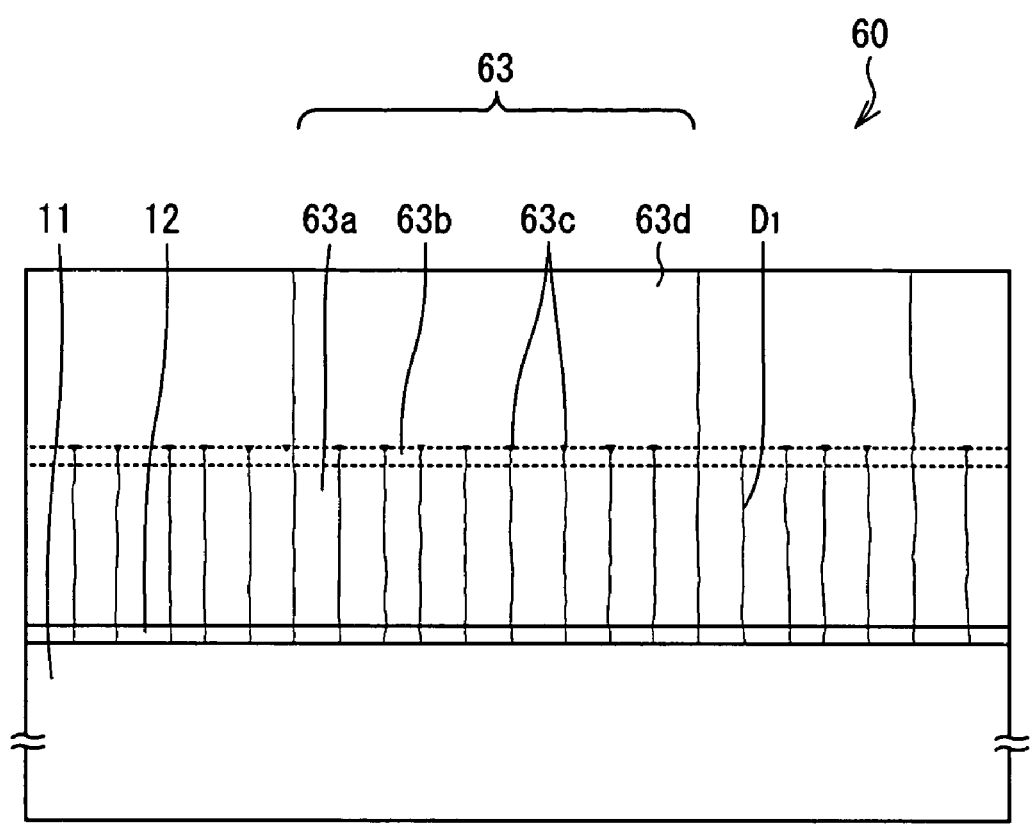
FIG. 10 is a view showing the structure of the substrate according to a sixth embodiment of the invention.

FIG. 10 schematically shows a crystal substrate 60 of a sixth embodiment. The crystal substrate 60 has the same structure as the crystal substrate 10 of the first embodiment except that a crystal layer 63 is provided instead of the crystal layer 13 of the first embodiment. The crystal substrate 60 is fabricated as follows.

Figure 11A:
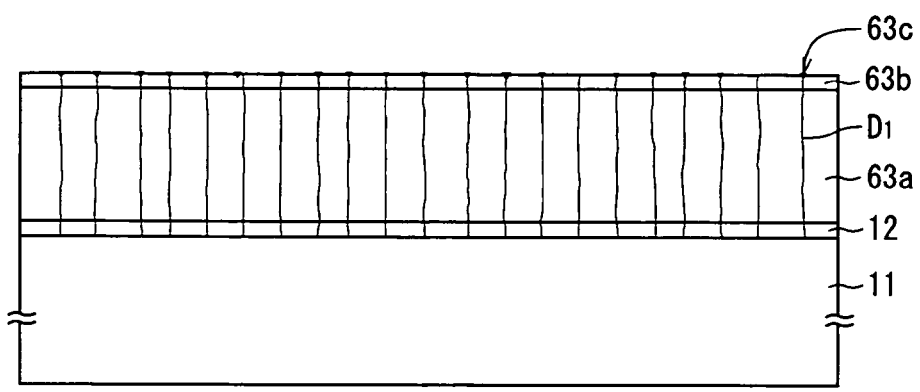
FIGS. 11A and 11B are views for explaining a method of manufacturing the crystal substrate shown in FIG. 10.
Figure 11B:
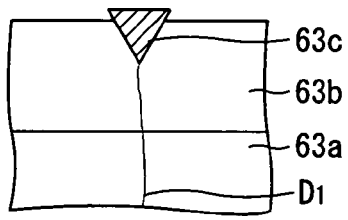

First, as shown in FIG. 11A, like the first embodiment, a lower layer 63a is grown and then the supply of the source gas of Group 3B elements is stopped to lower the growth temperature to 750° C. After that, the source gases of gallium and indium are supplied at appropriate ratio to grow a middle layer 63b made of $In_pGa_{1-p}N$ mix crystal (p≧0.05) 5 nm on the lower layer 63a. When InGaN mix crystal having the indium composition ratio of 5% or more is grown, as shown in FIG. 11B, metal indium is deposited corresponding to the threading dislocations $D_1$ spontaneously and a dislocation blocking portion 63c made of metal indium is formed.

Figure 12A:
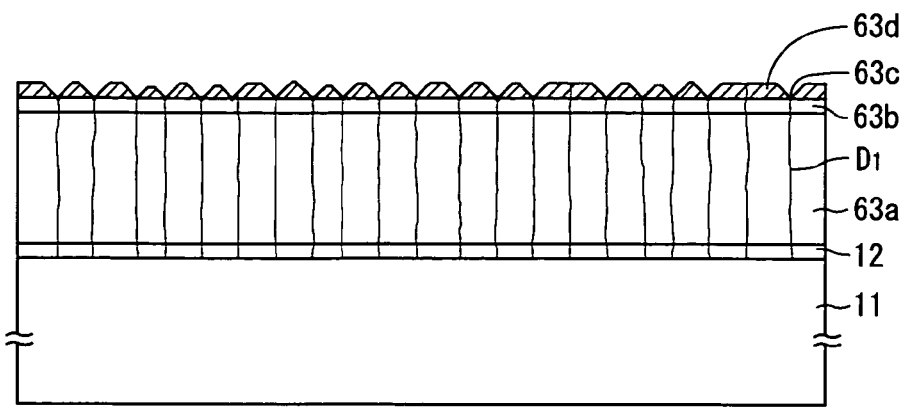
FIGS. 12A to 12C are views for explaining the steps of the manufacturing process continued from FIG. 11B.
Figure 12B:
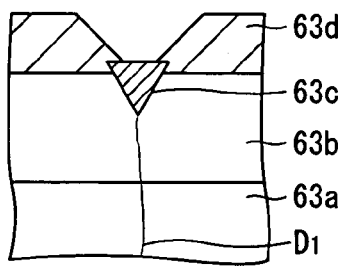
Figure 12C:
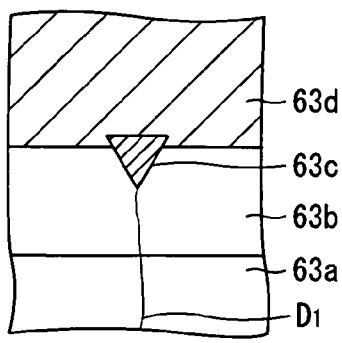

As shown in FIGS. 12A to 12C, for example, the supply of the source gas of indium is stopped and the growth temperature is raised to 1020° C., and an upper layer 63d made of nitride III-V compounds is grown on the middle layer 63b. The crystal growth of GaN does not easily occur from the dislocation blocking portion 63c compared to the middle layer 63b and the grown upper layer 63d, so the lateral growth from the upper layer 63d formed on the dislocation blocking portion 63c is advanced (FIG. 12B) and the propagation of threading dislocations $D_1$ is blocked. Further growth of the upper layer 63d substantially smoothes the growth surface (FIG. 12C), thereby the crystal layer 63 and the crystal substrate 60 are achieved.

As described, in the embodiment, the dislocation blocking portion 63c corresponding to each threading dislocation $D_1$ is provided in the middle layer 63b. As a result, the dislocation blocking portion 63c blocks each threading dislocation $D_1$ and enables to form the upper layer with the crystal having a low dislocation density. Therefore, the crystal layer 63 with simple structure and uniformly reduced threading dislocation density in the upper layer can be obtained.

Here, the dislocation blocking portion 63c is spontaneously formed. As a result, the threading dislocation density in the upper layer of the crystal layer 63 can be efficiently and easily reduced.

All crystal films and crystal substrates of the invention described above can be applicable to the semiconductor device. The crystal layers 13 to 63 which are obtained by removing the growth substrate 11 from the crystal substrates 10 to 60 of the embodiments or a thin film formed of part of the crystal layers 13 to 63 can be used for the semiconductor device as the nitride III-V compound substrate. In this case, the growth substrate 11 and the buffer layer 12 are removed by grinding, dry etching, wet etching or the like. The spaces 13a and 13b are distributed in planar shape in the crystal layer 13 of the first embodiment, so the mechanical strength in this part is weak. Therefore, the crystal layer 13 may be divided in this face and the lower layer and therebelow may be removed. Laser irradiation, lamp irradiation, ultrasonic wave application, quenching or rapid heating is performed to divide the crystal layer 13. In addition, the crystal layer 13 may be mechanically deformed and the upper layer separated by use of the spaces 13a and 13b. Further, after the separation of the upper layer, the separation surface of the upper layer can be polished to form the crystal layer (crystal film) including no spaces 13a and 13b. The polishing process of the separation surface may be carried out in the crystal layer (crystal film) level or after forming the device such as a laser diode on the crystal film as described later. This is applied when the crystal substrate 20 of the second embodiment to the crystal substrate 50 of the fifth embodiment is used.

Seventh Embodiment

In a seventh embodiment, a semiconductor device using the crystal substrate fabricated in the above embodiments will be described. Any crystal substrate of the above embodiments is similarly used because it is unnecessary to consider the difference of the internal structure of the crystal substrate. Therefore, as an example, a laser diode using the crystal substrate 40 will be described here.

Figure 13:
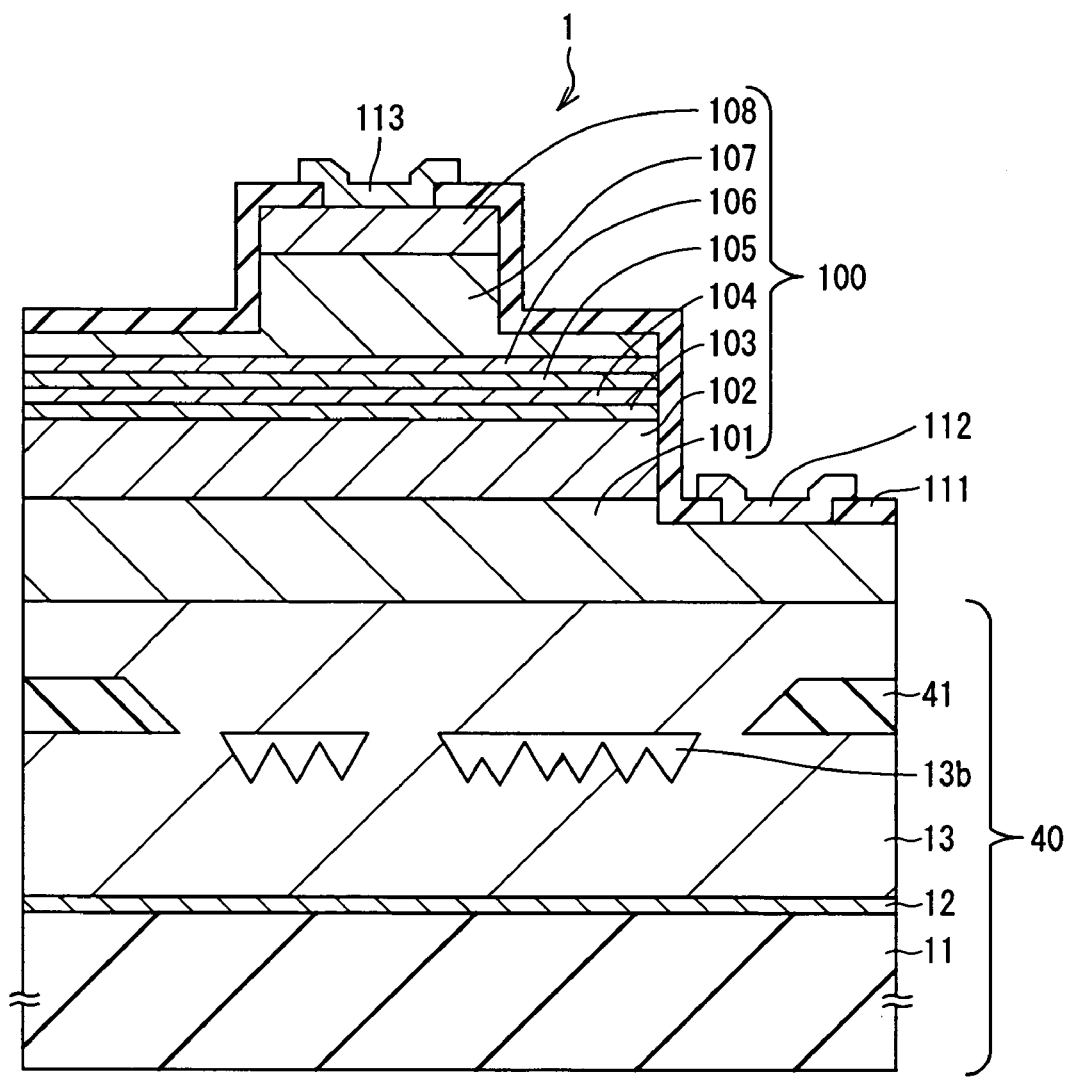
FIG. 13 is a sectional view showing the structure of the semiconductor device utilizing the crystal substrate shown in FIGS. 8A and 8B.

FIG. 13 shows a sectional structure of a laser diode 1 using the crystal substrate 40. The laser diode 1 is a SCH (Separate Confinement Heterostructure) structure of ridge waveguide. A semiconductor layer 100 comprising an n-side contact layer 101, an n-type cladding layer 102, an n-type guide layer 103, an active layer 104, a crystal antidegradation layer 105, a p-type guide layer 106, a p-type cladding layer 107 and a p-side contact layer 108 are formed on the crystal substrate 40 on the side where the crystal layer 13 is formed. The crystal substrate 40 comprises the growth substrate 11 made of sapphire with a thickness of 400 μm, the buffer layer 12 made of GaN with a thickness of 30 nm and the crystal layer 13 made of GaN with a thickness of 2 μm. The crystal substrate 40 is provided with the space 13b between the masks 41, so the threading dislocation density in the upper layer is uniformly low.

The semiconductor layer 100 has the structure as follows, for instance. The n-side contact layer 101 has a thickness of 2 μm and formed of an n-type GaN doped with silicon as an n-type impurity. The n-type cladding layer 102 has a thickness of 1 μm and formed of an n-type AlGaN mix crystal doped with silicon as an n-type impurity. The n-type guide layer 103 has a thickness of 0.1 μm and formed of an n-type GaN doped with silicon as an n-type impurity. The active layer 104 has a thickness of 30 nm and a multiple quantum well structure laminating $Ga_xIn_{1-x}N$ mix crystal layer and $Ga_yIn_{1-y}N$ (x≠y) mix crystal layer.

The crystal antidegradation layer 105 has a thickness of 20 nm and formed of a p-type AlGaN mix crystal doped with magnesium as a p-type impurity. The p-type guide layer 106 has a thickness of 0.1 μm and formed of a p-type GaN doped with magnesium as a p-type impurity. The p-type cladding layer 107 has a thickness of 0.8 μm and formed of a p-type AlGaN mix crystal doped with magnesium as a p-type impurity. The p-side contact layer 108 has a thickness of 0.5 μm and formed of a p-type GaN doped with magnesium as a p-type impurity. Part of the p-side contact layer 108 and the p-type cladding layer 107 is the ridge structure and constitute the current confinement part. Therefore, the part corresponding to the current confinement part in the active layer 104 is a light-emitting portion.

Here, each layer from the n-type cladding layer 102 to the p-side contact layer 108 is stacked on part of the n-side contact layer 101. The laminated part has a stripe shape.

The surfaces of the n-side contact layer 101 through the p-side contact layer 108 are covered with an insulating film 111 made of, for example, silicon dioxide. The openings are formed in the insulating film 111 above the n-side contact layer 101 and the p-side contact layer 108. An n-side electrode 112 and a p-side electrode 113 are respectively formed in the openings. The n-side electrode 112 has a structure where titanium (Ti) and aluminum (Al) are laminated in this order, for example and is in electrical contact with the n-side contact layer 101. The p-side electrode 113 has a structure that palladium (Pd), platinum (Pt) and gold (Au) are laminated in this order, for example and is in electrical contact with the p-side contact layer 108.

In the laser diode 1, a pair of side surfaces perpendicular to the elongated direction of the semiconductor layer 100 and facing each other are resonator end face, and a pair of reflector films are respectively formed thereon. A pair of reflector films are adjusted so that one of the reflector film has a low reflectance and the other reflector film has a high reflectance. Thereby, the light generated in the active layer 104 is amplified by traveling between a pair of reflector films and emitted from one of the reflector film as a laser beam. The laser diode 1 is housed in the package (not shown) when using.

The laser diode 1 is fabricated as follows, for example.

First, the crystal substrate 40 having a plurality of laser diode formation regions is prepared and the n-side contact layer 101, the n-type cladding layer 102, the n-type guide layer 103, the active layer 104, the crystal antidegradation layer 105, the p-type guide layer 106, the p-type cladding layer 107 and the p-side contact layer 108 are sequentially grown thereon by, for example, MOCVD to form the semiconductor layer 100. Generally, in order to prevent the degradation of light emitting property or improve the light emitting property, it is preferable that dislocations are not propagated at least to the light emitting portion and the light-emitting portion is a low dislocation density region. Here, the crystal substrate 40 whose surface has a uniformly low dislocation density is used, so the number of dislocations propagate to the semiconductor layer 100 is evenly reduced. Thereby, the light-emitting portion becomes the low dislocation density region.

Subsequently, the p-side contact layer 108, the p-type cladding layer 107, the p-type guide layer 106, the crystal antidegradation layer 105, the active layer 104, the n-type guide layer 103, the n-type cladding layer 102 and the n-side contact layer 101 are partially and sequentially etched to expose the n-side contact layer 101 on the surface. Next, a mask (not shown) is formed on the p-side contact layer 108 and the p-side contact layer 108 and the p-type cladding layer 107 are partially and selectively etched by use of the mask. Due to this, the top of the p-type cladding layer 107 and the p-side contact layer 108 become ridge shaped to form the current confinement part.

The insulating film 111 made of silicon dioxide is formed on the whole exposed surface by, for example, deposition. The opening is formed in the insulating film 111 corresponding to the p-side contact layer 108 to expose it on the surface. The opening is also formed in the insulating film 111 on the region of the n-side contact layer 101 and titanium, aluminum, platinum and gold are sequentially deposited on the opening and are alloyed to form the n-side electrode 112, for instance. Palladium, platinum and gold are sequentially deposited to correspond to the exposed p-side contact layer 108 to form the p-side electrode 113.

The growth substrate 11 is grinded to be a thickness of, for example, 80 µm. After that, the crystal substrate 40 is divided in the direction orthogonal to the elongated direction of the current confinement part. Thereby, a pair of resonator end surfaces of each laser diode 1 are formed and the reflector films (not shown) are respectively formed on the resonator end surfaces. Next, dependent upon each laser diode 1 formation region, the crystal substrate 40 is divided in the elongated direction of the current confinement part. Thereby, a plurality of laser diode 1 shown in FIG. 13 is achieved. The formed laser diode 1 is mounted in the package (not shown), for instance.

In the laser diode 1, when a predetermined voltage is applied between the n-side electrode 112 and the p-side electrode 113, current is applied to the active layer 104 and light emission occurs due to electron-hole recombination. Here, the semiconductor layer 100 is formed on the crystal layer 13 having a low dislocation density on the surface thereof, so the dislocation density from the n-side contact layer 101 to the p-side contact layer 108 is also low. Therefore, the laser diode 1 is superior in the light emitting property and has a longer life.

In the embodiment, the semiconductor layer 100 is provided on the crystal substrate 40 of the fourth embodiment. As a result, the semiconductor layer 100 has a significantly low dislocation density and excellent crystalline. Therefore, the laser diode 1 can prevent the degradation of the light emitting property, extend the life and improve reliability.

The substrate with the low dislocation density can be obtained with easy manufacturing method by using the crystal substrate 40 of the fourth embodiment. Furthermore, the productivity of the laser diode 1 is improved and the cost is reduced. The crystal substrate 40 has uniformly low dislocations on the surface thereof, so the semiconductor layer 100 can be formed on any regions on the surface of the crystal substrate 40. This eliminates the need to align the substrate. For comparison, in the crystal substrate using the general lateral growth, a lot of threading dislocations extended between the masks exist. So, the semiconductor layer is processed after align the position to have the light emitting portion on the top of the mask while avoiding threading dislocations.

Eighth Embodiment

In an eighth embodiment, a semiconductor device utilizing the crystal film fabricated in each embodiments described above will be explained. The crystal film can be fabricated with any methods. Here, as an example, a laser diode 2 in which the upper layer of the crystal layer 13 obtained by dividing the crystal substrate 10 is used as a nitride III-V compound substrate 81 will be described. The laser diode 2 has the same structure as the laser diode 1 except that current blocking layers 120 are provided on the both sides of the current confinement part and except the structure of the p-side electrode 113 and the n-side electrode 112.

Figure 14:
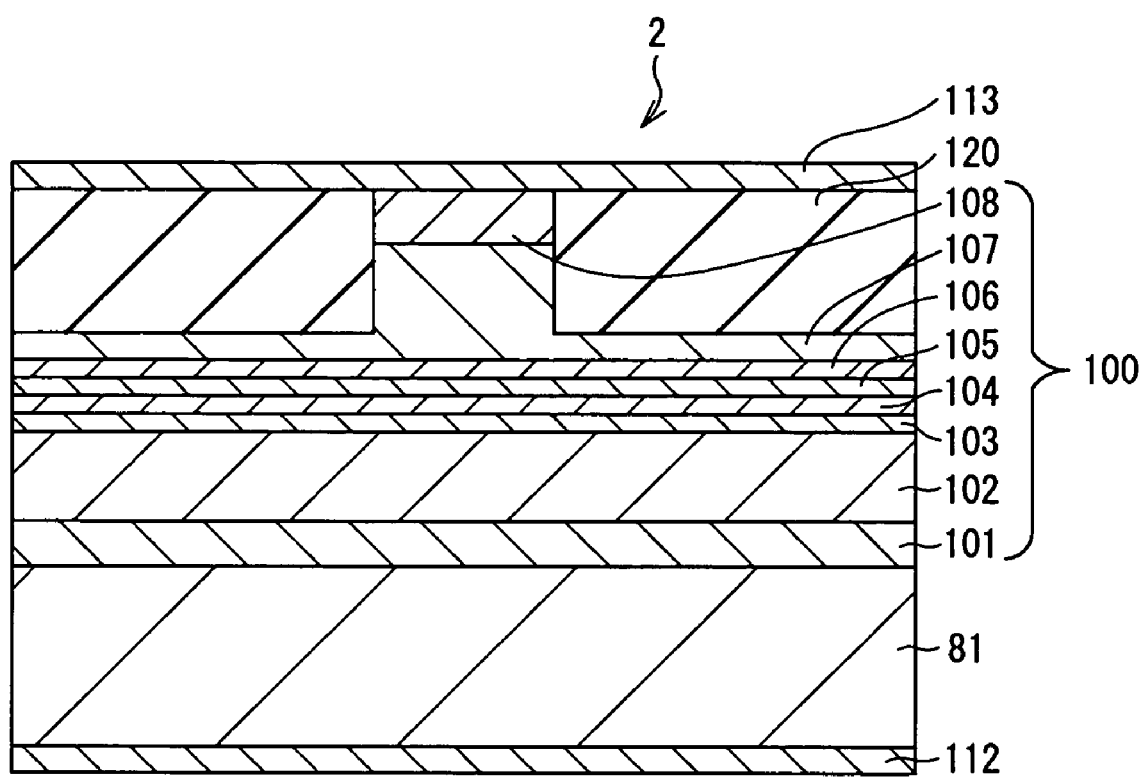
FIG. 14 is a sectional view showing the structure of the semiconductor device utilizing the crystal substrate according to the first embodiment of the invention.

FIG. 14 shows a sectional structure of the laser diode 2 of the eighth embodiment. The laser diode 2 has a structure that from the n-side contact layer 101 to the p-side contact layer 108 are sequentially laminated on a surface of the nitride III-V compound substrate 81 (abbreviated to substrate hereinbelow). The current blocking layers 120 are provided on the both sides of the current confinement part and the p-side electrode 113 is formed on the whole surface of the p-side contact layer 108 and the current blocking layer 120. Further, the n-side electrode 112 is formed on the backside of the substrate 81.

The substrate 81 is the substrate in which the growth substrate 11, the buffer layer 12, the lower layer of the crystal layer 13 are removed from the crystal substrate 10 (FIG. 1). The surface distributing the spaces 13a and 13b has weak strength, so laser irradiation, lamp irradiation, ultrasonic wave application, quenching or rapid heating is performed thereon to divide the crystal layer 13 from this face and to remove the lower layer of the crystal layer 13 and therebelow, for example. Besides, the upper layer of the crystal layer 13 may be divided from the surface distributing the spaces 13a and 13b by mechanically deforming. The lower layer of the crystal layer 13 and therebelow can be removed by performing grinding, dry etching or wet etching (chemical etching) on the growth substrate 11.

The current blocking layer 120 keeps the insulation with the surroundings and is formed of the n-type AlGaN mix crystal doped with an n-type impurity such as silicon. Therefore, in the laser diode 2, the part corresponding to the current confinement part in the active layer 104 is the light-emitting portion. The current blocking layer 120 is formed by re-growing on the p-type cladding layer 107 after making the top of the p-type cladding layer 107 and the p-side contact layer 108 ridge shape.

The laser diode 2 has the same structure as the general AlGaAs or AlGaInP laser diode provided with the electrode on the backside of the substrate and can be manufactured as the same process thereof. For example, after growing each layer of the semiconductor layer 100, the top of the p-type cladding layer 107 and the p-side contact layer 108 are processed to be ridge shaped, and a resist film is formed thereon. Then, the insulating film is formed on the whole surface of the semiconductor layer 100 and is removed with the resist film thereon to form the current blocking layer 120 (lift-off). Further, the p-side electrode 113 is formed on the whole top surface of the current blocking layer 120 and the n-side electrode 112 is formed on the backside of the substrate 81. The laser diode 2 fabricated as described above can utilize the same package as the general AlGaAs or AlGaInP laser diode.

Here, the semiconductor layer 100 is provided on the substrate 81 having low dislocation density. As a result, the dislocation density from the n-side contact layer 101 to the p-side contact layer 108 is also low. Therefore, the laser diode 2 has a excellent light emitting property and longer life.

As described, in the embodiment, the semiconductor layer 100 is provided on the substrate 81. As a result, the semiconductor layer 100 has an extremely low dislocation density and excellent crystalline. Therefore, the laser diode 2 can prevent the degradation of the light emitting property, realize longer life and improve reliability.

In addition, the conductive substrate 81 is used and the n-side electrode 112 is provided on the backside thereof. As a result, compared to the laser diode 1, the structure is simplified and the mass productivity is excellent. Further, in the laser diode 2, the thickness of the substrate 81 can be reduced. This can achieve simple laser structure and reduction in size.

As described above, although the present invention is described referring to the embodiments, the present invention is not limited to the embodiments, and can be variously modified. For example, in the second through fifth embodiments, the etch pits $13a_1$ to $33a_1$ and $13b_1$ to $33b_1$ are formed and the spaces are formed by using these etch pits. However, growth pits $13a_2$ and $13b_2$ are formed instead of the etch pits $13a_1$ to $33a_1$ and $13b_1$ to $33b_1$ and the spaces 13a and 13b may be formed by using growth pits. In the fourth and fifth embodiments, the spaces 13a and 13b are provided like the first embodiment. However, the coat film 21 or the surface treatment region 33c may be provided like the second and the third embodiments. The invention can combine any kinds within the above-described embodiments.

In the embodiments, one space layer distributed on the surface is provided. However, a plurality of space layers may be provided by performing the etch pits (or growth pits) formation step and the crystal growth step twice or more respectively. Thereby, the dislocation density in the upper layer of the crystal film can be further reduced efficiently.

In the embodiments, the crystal layers 13, 53, 63 and 73 made of nitride III-V compounds are described as an example. However, the crystal film may be formed of other III-V compounds such as GaAs or InP. The invention is similarly applicable to the crystal film, the crystal substrate other than the III-V compounds and the semiconductor device using thereof.

In the seventh and the eighth embodiments, the laser diodes 1 and 2 are described as the semiconductor device. However, the invention is applicable to the other semiconductor device such as a light-emitting diode or a field-effect transistor.

As described, according to the crystal film of the invention, the spaces are formed in each end of dislocation. As a result, the number of dislocations propagated to the upper layer is reduced and the dislocation density in the upper layer is uniformly and effectively reduced. Specifically, according to the crystal film of the invention, the crystal film is divided in the surface distributing the spaces and is constituted of at least part of the upper layer. As a result, the crystal thin film having homogenized and excellent crystalline can be obtained.

Further, according to the crystal film of one aspect of the invention, the dislocation blocking region for blocking the propagation of dislocations is formed in each end of dislocation. As a result, each dislocation is blocked and the dislocation density in the upper layer is effectively and uniformly reduced.

Furthermore, the crystal substrate of the invention comprises the crystal film of the invention. Therefore, the dislocation density on the upper surface can be effectively and uniformly reduced.

In addition, the semiconductor device of the invention comprises the crystal film of the invention. Therefore, the performance and the productivity can be improved.

Obviously many modifications and variations of the present invention are possible in the light of the above teachings. It is therefore to be understood that within the scope of the appended claims, the invention may be practiced otherwise than as specifically described.

The invention claimed is:

1. A crystal film comprising:
    a crystal layer having a first layer and an upper layer, said first layer being between a base layer and said upper layer,
    wherein a threading dislocation within said base layer propagates into said first layer,
    wherein a pit extends into said first layer, said threading dislocation terminating at said pit, and
    wherein said upper layer covers said pit, the covered pit being a space between said first layer and said upper layer.

2. A crystal film according to claim 1, wherein said first layer is a lower layer, said lower layer and said upper layer being of a same material.

3. A crystal film according to claim 1, wherein said first layer includes a lower layer and a middle layer, said lower layer being between said base layer and said middle layer, and said middle layer being between said lower layer and said upper layer.

4. A crystal film according to claim 3, wherein said threading dislocation propagates into said lower layer, and said pit extends into said middle layer.

5. A crystal film according to claim 3, wherein said lower layer, said middle layer, and said upper layer are of a same material.

6. A crystal film according to claim 1, wherein a coat film is on an inner surface of said space.

7. A crystal film according to claim 6, wherein said coat film is an amorphous material.

8. A crystal film according to claim 6, wherein said coat film includes at least one of oxygen, nitrogen, fluorine and carbon.

9. A crystal film according to claim 1, wherein a surface treatment region is on an inner surface of said space.

10. A crystal film according to claim 9, wherein said surface treatment region includes at least one of oxygen, nitrogen, fluorine and carbon.

11. A crystal film according to claim 1, wherein a dislocation blocking portion is on an inner surface of said space.

12. A crystal film according to claim 11, wherein said dislocation blocking portion includes indium.

13. A crystal film according to claim 1, wherein said base layer is between a growth substrate and the crystal film.

14. A crystal film according to claim 1, wherein said threading dislocation extends to an apex of said pit.

* * * * *